US012760420B2

(12) United States Patent
Huang et al.

(10) Patent No.: US 12,760,420 B2
(45) Date of Patent: Oct. 13, 2026

(54) APPARATUS AND METHODS TO PROMOTE WAFER EDGE TEMPERATURE UNIFORMITY

(71) Applicant: Applied Materials, Inc., Santa Clara, CA (US)

(72) Inventors: Zubin Huang, Santa Clara, CA (US); Jallepally Ravi, San Ramon, CA (US); Cheng Cheng, San Jose, CA (US); Peiqi Wang, Campbell, CA (US); Kai Wu, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 480 days.

(21) Appl. No.: 17/862,138

(22) Filed: Jul. 11, 2022

(65) Prior Publication Data

US 2023/0357929 A1 Nov. 9, 2023

Related U.S. Application Data

(60) Provisional application No. 63/338,661, filed on May 5, 2022.

(51) Int. Cl.

| | |
|---|---|
| ***C23C 16/458*** | (2006.01) |
| ***C23C 16/455*** | (2006.01) |
| ***C23C 16/46*** | (2006.01) |
| ***H10P 72/76*** | (2026.01) |

(52) U.S. Cl.
CPC .... *C23C 16/4585* (2013.01); *C23C 16/45565* (2013.01); *C23C 16/46* (2013.01); *H10P 72/7606* (2026.01)

(58) Field of Classification Search
None
See application file for complete search history.

(56) References Cited

U.S. PATENT DOCUMENTS 5,800,686 A 9/1998 Littau et al.
5,882,417 A 3/1999 van de Ven et al.
6,206,976 B1 * 3/2001 Crevasse ........... H01L 21/68735 118/728

(Continued)

FOREIGN PATENT DOCUMENTS

KR 1020140047558 A 4/2014

OTHER PUBLICATIONS

International Search Report and Written Opinion dated Jun. 29, 2023 for Application No. PCT/US2023/014941.

(Continued)

*Primary Examiner* — Jeffrie R Lund
*Assistant Examiner* — Tiffany Z Nuckols
(74) *Attorney, Agent, or Firm* — Patterson + Sheridan, LLP

(57) ABSTRACT

A shadow ring for a processing chamber, such as a semiconductor processing chamber, is an annular member including a body with a radially inwardly projecting lip. The shadow ring includes a feature that mitigates heat transfer between the lip and the rest of the body. In one example, the (Continued)

feature includes a plurality of apertures, each aperture extending from an upper opening at an upper surface of the shadow ring to a corresponding lower opening at a lower surface of the shadow ring. A neck between adjacent apertures creates a bottleneck that hinders conductive heat transfer.

20 Claims, 6 Drawing Sheets

(56) References Cited

U.S. PATENT DOCUMENTS 6,296,712 B1 * 10/2001 Guo .................. C23C 16/45521 118/500
2001/0042514 A1 * 11/2001 Mizuno .................. C23C 16/54 118/728
2008/0178797 A1 * 7/2008 Fodor ..................... C23C 16/46 118/75
2014/0235063 A1 8/2014 McMillin et al.
2015/0170955 A1 6/2015 Ouye et al.
2017/0186587 A1 * 6/2017 Kawanabe .......... H01J 37/3244
2018/0142340 A1 5/2018 Johanson et al.
2019/0153592 A1 5/2019 Bois et al.
2021/0202217 A1 7/2021 Lim et al.

OTHER PUBLICATIONS

Aremco, High Temperature Emissivity Coatings, Technical Bulletin A5-S2A Emissivity, Rev. 8/19.
Silvia Trevisan, Wujun Wang, Bjorn Laumert, Coatings utilization to modify the effective properties of high temperature; Applied Thermal Engineering; Dec. 5, 2020; https://doi.org/10.1016/j.applthermaleng.2020.116414.
Technical Information Data Bulletin, Infrared Thermometer and Emissivity, How to Determine Emissivity Values; Temperature & Process Instruments, Inc.; https://www.tnp-instruments.com/.
Gabriele Steinborn et al., Porous TiO2—Y203 Ceramics with Specific Infrared-Optical Properties; Journal of Ceramic Science and Technology 02[03] 183-190 (2011).
Jim W. Stendera, Sam Bonsall, High Emissivity Coatings-Do they Really Work?, RWF-paper-100164; Refractories World Forum 4 (2012) [1], pp. 67-71.
Korean Office Action for Application No. 10-2024-7039967 dated Mar. 22, 2026.

* cited by examiner

APPARATUS AND METHODS TO PROMOTE WAFER EDGE TEMPERATURE UNIFORMITY

CROSS-REFERENCE TO RELATED APPLICATIONS

This application claims benefit of U.S. Provisional Application No. 63/338,661; filed May 5, 2022; which is herein incorporated by reference in its entirety.

BACKGROUND

Field

Embodiments of the present disclosure generally relate to substrate processing, such as semiconductor substrate processing.

Description of the Related Art

Semiconductor substrates are processed for a wide variety of applications, including the fabrication of integrated devices and microdevices. During processing, the substrate is positioned on a substrate support within a processing chamber. In some processes, the substrate is heated by a heater embedded in the substrate support. The interior of the processing chamber is placed under vacuum while the substrate is processed by exposure to heat and process gases. In some processes, such as chemical vapor deposition (CVD) processes, the deposition of substances at the edge of a substrate leads to flaking of the deposited layers, which adversely impacts the product yield from a substrate. Typically, such edge deposition is addressed by use of a shadow ring that sits above a substrate, and overlaps with the edge of the substrate. However, the shadow ring tends to act as a heat sink drawing heat away from the substrate, which adversely affects the uniformity of deposition of substances onto the substrate.

Thus, there is a need for improved apparatus that facilitates the processing of substrates.

SUMMARY

The present disclosure generally relates to substrate processing, and particularly to apparatus and systems that promote a uniform deposition of substances onto a substrate by mitigating detrimental heat loss from the substrate.

In one embodiment, a shadow ring for a processing chamber includes an annular member. The annular member includes a body and a lip projecting radially inwardly from the body. The shadow ring further includes a plurality of apertures, each aperture extending from a corresponding upper opening at an upper surface of the shadow ring to a corresponding lower opening at a lower surface of the shadow ring.

In one embodiment, a processing chamber includes a chamber body and a substrate support enclosed within the chamber body. The substrate support includes a first material including a first emissivity and a coating of a second material on at least a portion of a surface of the substrate support. The second material includes a second emissivity greater than the first emissivity.

In one embodiment, a processing chamber includes a chamber body and a liner disposed within the chamber body, the liner including a heater. The processing chamber further includes a substrate support enclosed within the chamber body, and movable between a raised position and a lowered position, a purge ring disposed on the substrate support, and a shadow ring. When the substrate support is in the raised position, the shadow ring is disposed on the purge ring. When the substrate support is in the lowered position, the shadow ring is disposed on the liner.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

FIGS. 2A-21 are schematic views of embodiments of a shadow ring.

FIG. 3 is a schematic cross-sectional view of an embodiment of a shadow ring.

FIG. 4 is a schematic cross-sectional view of an embodiment of a substrate support.

FIG. 5 is a schematic cross-sectional view of a portion of the processing chamber of FIG. 1 incorporating another embodiment.

FIG. 6 is a graph illustrating an exemplary result obtained from implementing an embodiment of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
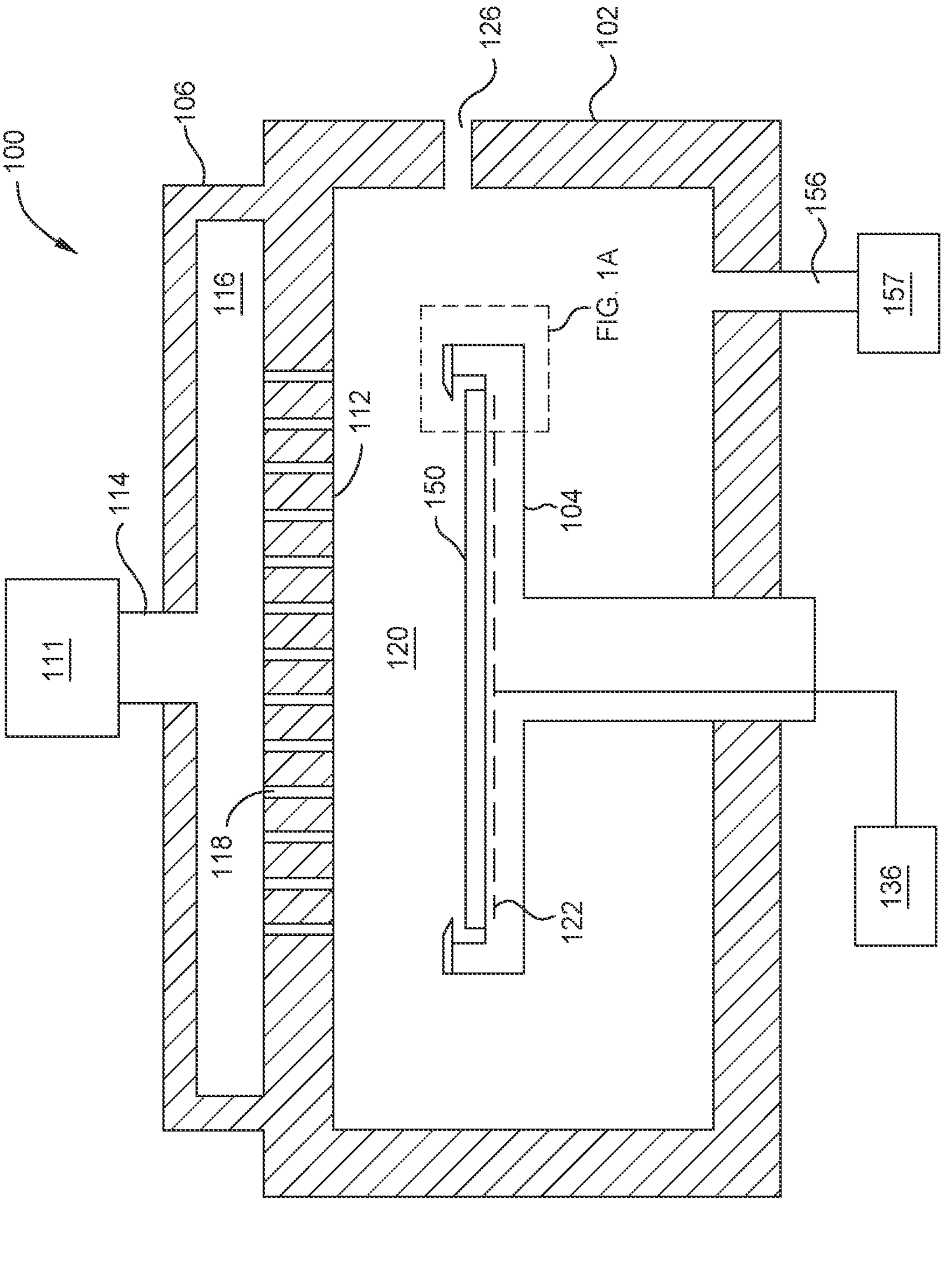
FIG. 1 is a schematic cross-sectional view of a processing chamber.

The present disclosure concerns substrate processing and components for chambers used in substrate processing. FIG. 1 illustrates a schematic cross-sectional view of a processing chamber 100. As illustrated, the processing chamber 100 is configured as a CVD chamber, although in some embodiments, processing chamber 100 may be configured to perform another processing operation, such as a processing operation that involves plasma. The processing chamber 100 features a chamber body 102, a substrate support 104 disposed inside the chamber body 102, and a lid 106 coupled to the chamber body 102, and enclosing the substrate support 104 in a processing volume 120. The substrate support 104 is configured to support a substrate 150 thereon during processing. As illustrated, a heating element 122 is embedded within the substrate support 104. The heating element 122 is coupled to a power source 136. The substrate 150 is provided to the processing volume 120 through an opening 126.

The substrate support 104 contains, or is formed from, one or more metallic or ceramic materials. Exemplary metallic or ceramic materials include one or more metals, metal oxides, metal nitrides, metal oxynitrides, or any combination thereof. For example, the substrate support 104 may contain or be formed from aluminum, aluminum oxide, aluminum nitride, aluminum oxynitride, or any combination thereof.

An exhaust port 156 is coupled to a vacuum pump 157. The vacuum pump 157 removes excess process gases or by-products from the processing volume 120 via the exhaust port 156 during and/or after processing.

A gas supply source 111 includes one or more gas sources. The gas supply source 111 is configured to deliver the one or more gases from the one or more gas sources to the processing volume 120. Each of the one or more gas sources provides a processing gas (such as argon, hydrogen or helium). In some embodiments, one or more of a carrier gas and an ionizable gas may be provided into the processing volume 120 along with one or more precursors. When processing a 300 mm substrate, the processing gases are introduced to the processing chamber 100 at a flow rate from about 6500 sccm to about 8000 sccm, from about 100 sccm to about 10,000 sccm, or from about 100 sccm to about 1000 sccm. Alternatively, other flow rates may be utilized. In some examples, a remote plasma source can be used to deliver plasma to the processing chamber 100 and can be coupled to the gas supply source 111.

The showerhead 112 features openings 118 for admitting process gas or gases into the processing volume 120 from the gas supply source 111. The process gases are supplied to the processing chamber 100 via a gas feed 114, and the process gases enter a plenum 116 prior to flowing through the openings 118. In some embodiments, different process gases that are flowed simultaneously during a processing operation enter the processing chamber 100 via separate gas feeds and separate plenums prior to entering the processing volume 120 through the showerhead 112.

Figure 1A:
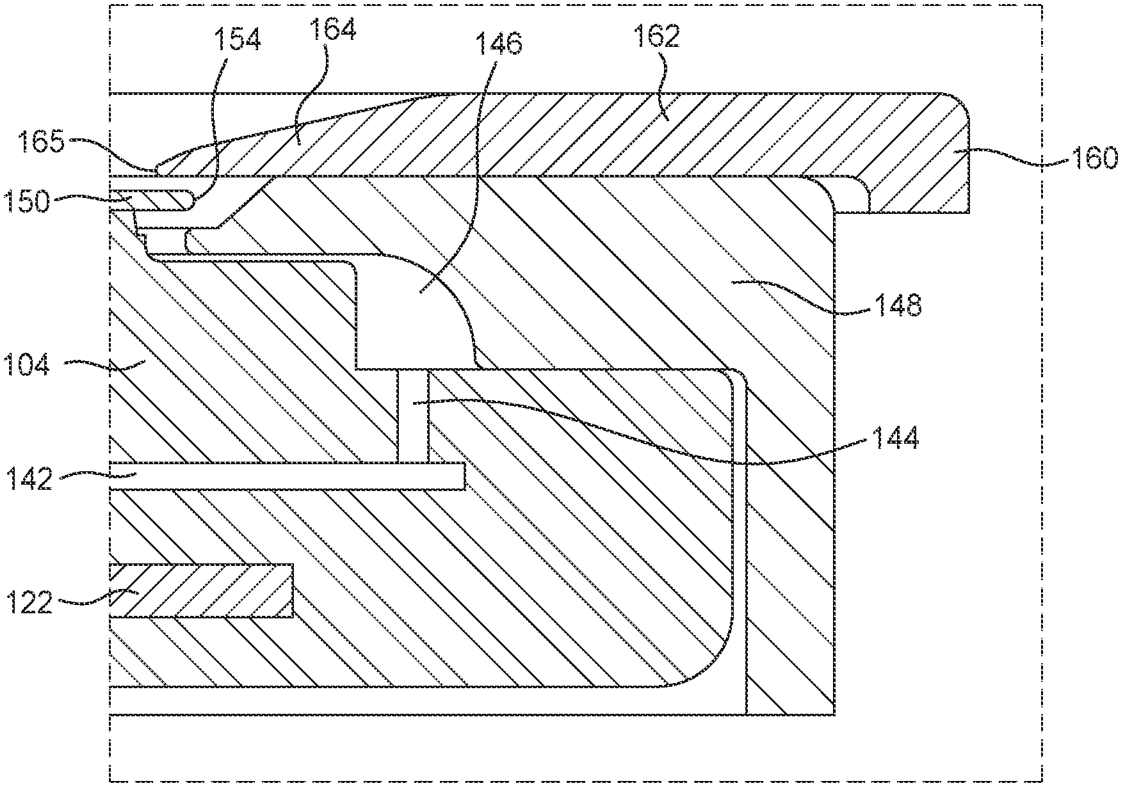
FIG. 1A is an enlargement of a portion of FIG. 1.

FIG. 1A is an enlargement of a portion of FIG. 1. The substrate support 104 includes one or more channels 142 that convey a purge gas. The purge gas exits the one or more channels 142 via one or more ports 144. The ports 144 open into a pocket 146 formed between the substrate support 104 and a purge ring 148. The purge ring 148 is an annular member that sits upon the substrate support 104. As illustrated, in some embodiments, the purge ring 148 encircles the substrate 150. In some embodiments, the purge ring 148 is made from a ceramic material, such as aluminum oxide or aluminum nitride.

When the substrate 150 is being processed, a shadow ring 160 sits on an upper surface of the purge ring 148. The shadow ring 160 is removable from the purge ring 148 in order to facilitate placement and removal of the substrate 150 onto, and from, the substrate support 104. In some embodiments, the shadow ring 160 is made from a ceramic material, such as aluminum oxide or aluminum nitride. The shadow ring 160 is an annular member, including a body 162 and a radially inward lip 164 that extends to an inner edge 165. The shadow ring 160 is sized such that the lip 164 is positioned above the edge 154 of the substrate 150 when the substrate 150 is positioned on the substrate support 104. As illustrated, in some embodiments, the lip 164 of the shadow ring 160 partially overlaps the substrate 150.

When the substrate 150 is being processed, the purge gas exits the ports 144 into the pocket 146, then flows from the pocket 146 between the purge ring 148 and the substrate support 104 towards the substrate 150. The purge ring 148 and the shadow ring 160 route the purge gas around the edge 154 of the substrate 150 and between the substrate 150 and the lip 164 of the shadow ring 160.

When the substrate 150 is being processed, the heating element 122 heats the substrate support 104 and the purge gas flowing through the one or more channels 142. The substrate support 104 heats the substrate 150. The portion of the substrate 150 overlapped by the shadow ring 160 loses heat to the lip 164 of the shadow ring 160. The loss of heat to the lip 164 of the shadow ring 160 is promoted by the proximity of the shadow ring 160 to the substrate 150 where the shadow ring 160 overlaps the substrate 150. Without being bound by theory, it is postulated that at the typical pressures of processing operations, a primary mechanism of heat transfer from the substrate 150 to the shadow ring 160 is by radiation.

Although the lip 164 of the shadow ring 160 is heated by heat transfer from the substrate 150, the lip 164 conducts heat to the rest of the body 162 of the shadow ring 160. A temperature of the lip 164 can remain lower than the temperature of the substrate 150 near the edge 154, which provides a temperature gradient driving further heat transfer from the substrate 150 to the lip 164 of the shadow ring 160. The temperature of the substrate 150 near the edge 154 can decrease and adversely affect the uniformity of deposition onto the substrate 150.

In some embodiments of the present disclosure, the shadow ring 160 includes one or more features configured to mitigate the effects of the transfer of heat from the substrate 150 to the shadow ring 160. In some embodiments, the shadow ring 160 is adapted such that heat conduction from the lip 164 to the rest of the body 102 of the shadow ring 160 is assuaged. In some embodiments, the shadow ring 160 is adapted such that heat transfer from the substrate 150 to the lip 164 of the shadow ring 160 is hindered.

Figure 2A:
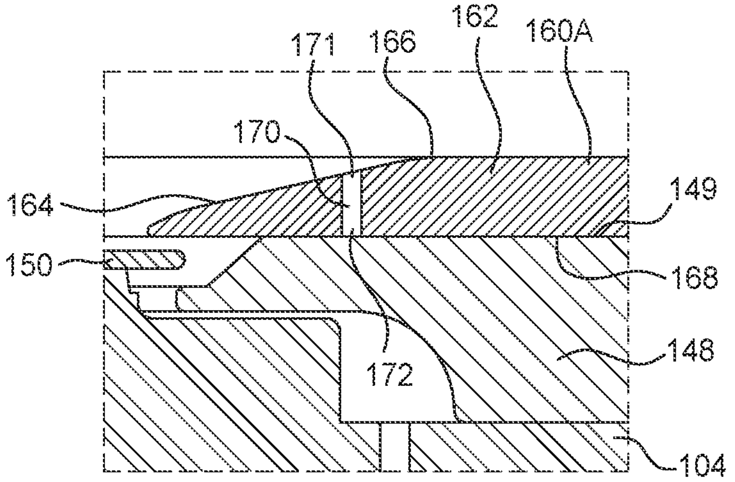
Figure 2B:
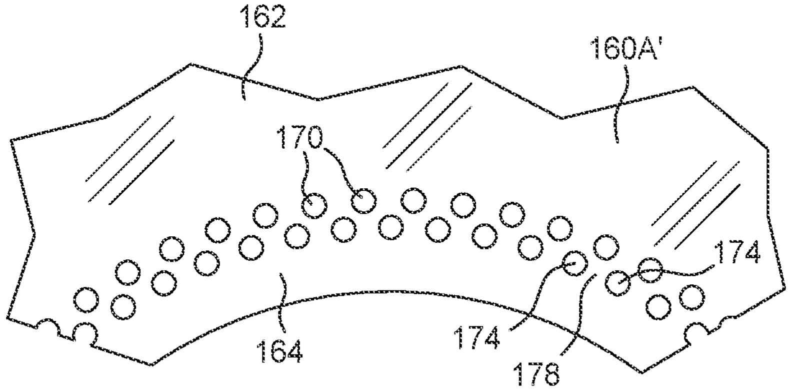

FIGS. 2A-21 are schematic views of embodiments of the shadow ring 160; other items that are common with those depicted in FIGS. 1 and 1A are labeled with the same reference numbers as in FIGS. 1 and 1A. In FIGS. 2A and 2B, the shadow ring 160 is represented by shadow ring 160A. FIG. 2A is a schematic cross-sectional view of a portion of the shadow ring 160A in place on the purge ring 148. FIG. 2B is a schematic plan view of a portion of the shadow ring 160A.

The shadow ring 160A is a monolithic body. As shown in FIG. 2A, the shadow ring 160A includes one or more apertures 170. The one or more apertures 170 extend between an upper opening 171 in an upper surface 166 of the shadow ring 160A to a lower opening 172 in a lower surface 168 of the shadow ring 160A. The one or more apertures 170 are positioned such that the lower opening 172 in the lower surface 168 is obscured by the upper surface 149 of the purge ring 148. In some embodiments, the interface between the upper surface 149 of the purge ring 148 and the lower surface 168 of the shadow ring 160A is configured to hinder passage of the purge gas between the purge ring 148 and the shadow ring 160A towards the lower opening 172. In an example, the upper surface 149 of the purge ring 148 and/or the lower surface 168 of the shadow ring 160A include a low roughness surface finish, such as a polished surface finish.

In FIG. 2B, the shadow ring 160A is represented by shadow ring 160A'. The shadow ring 160A' includes a plurality of apertures 170, represented as holes 174, such as circular holes drilled through the shadow ring 160A'. Each pair of adjacent holes 174 is separated by a neck 178 of the body 162 of the shadow ring 160A'. In some embodiments, the holes 174 are arranged in a circle such that the holes 174 are equidistant from a geometric center of the shadow ring 160A'. As illustrated, in some embodiments, the holes 174 are arranged in concentric circles-one circle surrounding another circle-centered on the geometric center of the shadow ring 160A'.

In some embodiments, each hole 174 of one circle of holes 174 is aligned with a corresponding hole 174 of another circle of holes 174 along a radius from the geometric center of the shadow ring 160A'. As illustrated, in some embodiments, each hole 174 of one circle of holes 174 is not aligned with a corresponding hole 174 of another circle of holes 174 along a radius from the geometric center of the shadow ring 160A'.

Figure 2C:
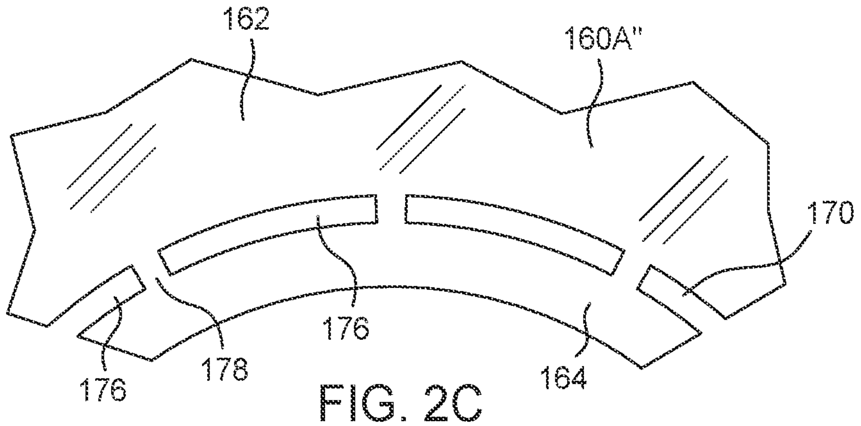

FIG. 2C is a schematic plan view of a portion of the shadow ring 160A. In FIG. 2C, the shadow ring 160A is represented by shadow ring 160A". The shadow ring 160A" includes a plurality of apertures 170, represented as slots 176. Each pair of adjacent slots 176 is separated by a neck 178 of the body of the shadow ring 160A". As illustrated, in some embodiments, the slots 176 are arranged in a circle such that the slots 176 are equidistant from a geometric center of the shadow ring 160A". In some embodiments, the slots 176 are arranged in concentric circles-one circle surrounding another circle-centered on the geometric center of the shadow ring 160A".

In some embodiments, the shadow ring 160A of FIGS. 2A-2C may include at least one aperture 170 in the form of a hole 174 and at least one aperture 170 in the form of a slot 176, with a neck 178 therebetween.

In the shadow ring 160A of any of FIGS. 2A-2C, the transmission of heat from the lip 164 to the rest of the body 162 is constrained to conduction through the necks 178 between the apertures 170. Without being bound by theory, it is postulated that, in operation, the necks 178 act as bottlenecks that hinder heat conduction. It is further postulated that the necks 178 prevent the lip 164 from conducting heat to the rest of the body 162 as rapidly as the lip 164 receives heat from the substrate 150. The temperature of the lip 164 increases, the rate of heat transfer from the substrate 150 to the lip 164 diminishes, and heat loss from the substrate 150 to the lip 164 reduces.

Figure 2D:
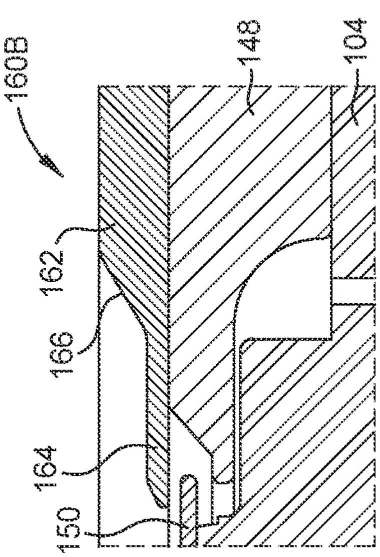

FIG. 2D is a schematic cross-sectional view of a portion of the shadow ring 160 in place on the purge ring 148. In FIG. 2D, the shadow ring 160 is represented by shadow ring 160B. The shadow ring 160B is a monolithic body. The upper surface 166 of the shadow ring 160B is contoured such that the shadow ring 160B is stepped from the lip 164 to the rest of the body 162. As illustrated, in a vertical plane, the lip 164 is thinner than the rest of the body 162, and extends radially inwardly from a location above the purge ring 148. Without being bound by theory, it is postulated that, in operation, the reduced thickness of the lip 164 and the length of the lip 164 act as a bottleneck that hinders heat conduction away from the lip 164 to the rest of the body 162 of the shadow ring 160B.

Figure 2E:
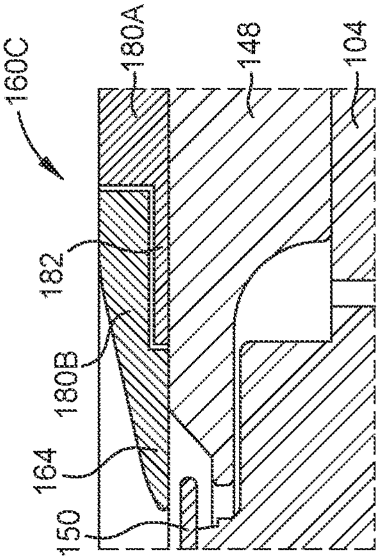

FIG. 2E is a schematic cross-sectional view of a portion of the shadow ring 160 in place on the purge ring 148. In FIG. 2E, the shadow ring 160 is represented by shadow ring 160C. The shadow ring 160C is not a monolithic body, but includes two separate parts, an outer body 180A and an inner body 180B. The outer body 180A includes a radially inwardly projecting flange 182. The inner body 180B includes the lip 164, and is at least partially disposed on the flange 182. In some embodiments, the inner body 180B rests on the flange 182. In some embodiments, the inner body 180B is separated from the flange 182 by a gap. Without being bound by theory, it is postulated that, in operation, the provision of the shadow ring 160 as two separate parts hinders heat conduction away from the lip 164 through the inner body 180B to the outer body 180A, especially when a gap exists between at least some adjacent portions of the inner body 180B and the outer body 180A.

Figure 2F:
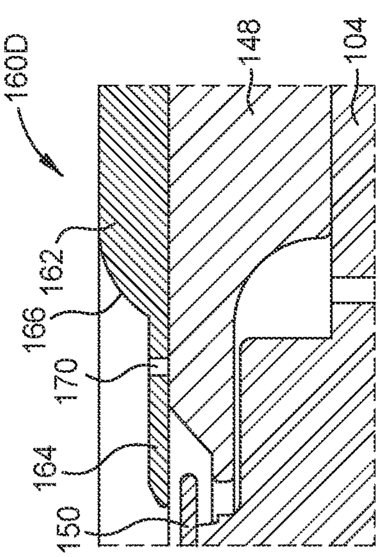

FIG. 2F is a schematic cross-sectional view of a portion of the shadow ring 160 in place on the purge ring 148. In FIG. 2F, the shadow ring 160 is represented by shadow ring 160D. The shadow ring 160D is a monolithic body. The shadow ring 160D includes a combination of the one or more apertures 170 of the shadow ring 160A and the stepped configuration of the shadow ring 160B. As illustrated, in some embodiments, the one or more apertures 170 may be located within the lip 164. In some embodiments, the one or more apertures 170 may be located within the body 162. In some embodiments, the one or more apertures 170 may be located within the lip 164 and within the body 162.

Figure 2G:
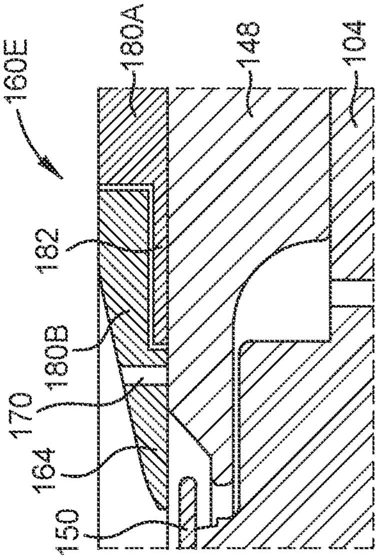

FIG. 2G is a schematic cross-sectional view of a portion of the shadow ring 160 in place on the purge ring 148. In FIG. 2G, the shadow ring 160 is represented by shadow ring 160E. The shadow ring 160E is not a monolithic body. The shadow ring 160E includes a combination of the one or more apertures 170 of the shadow ring 160A and the two-piece configuration of the shadow ring 160C. As illustrated, in some embodiments, the one or more apertures 170 may be located within the inner body 180B. In some embodiments, the one or more apertures 170 may be located within the outer body 180A. In some embodiments, the one or more apertures 170 may be located within the inner body 180B and within the outer body 180A.

Figure 2H:
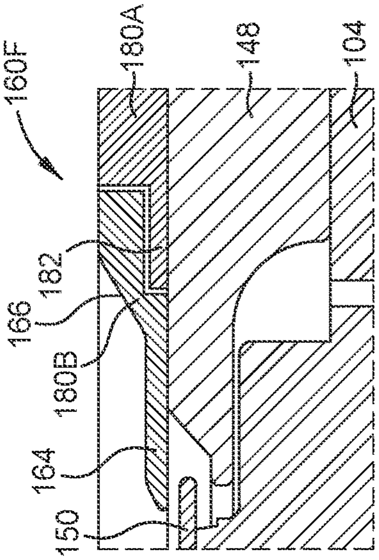

FIG. 2H is a schematic cross-sectional view of a portion of the shadow ring 160 in place on the purge ring 148. In FIG. 2H, the shadow ring 160 is represented by shadow ring 160F. The shadow ring 160F is not a monolithic body. The shadow ring 160F includes a combination of the stepped configuration of the shadow ring 160B and the two-piece configuration of the shadow ring 160C. As illustrated, in some embodiments, the stepped configuration may be formed on the inner body 180B. In some embodiments, the stepped configuration may be formed on the outer body 180A. In some embodiments, the stepped configuration may be formed at least in part on the inner body 180B and at least in part on the outer body 180A.

Figure 2I:
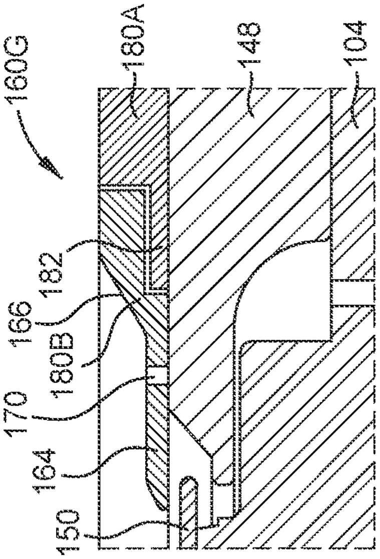

FIG. 2I is a schematic cross-sectional view of a portion of the shadow ring 160 in place on the purge ring 148. In FIG. 2I, the shadow ring 160 is represented by shadow ring 160G. The shadow ring 160G is not a monolithic body. The shadow ring 160G includes a combination of the one or more apertures 170 of the shadow ring 160A, the stepped configuration of the shadow ring 160B, and the two-piece configuration of the shadow ring 160C.

As illustrated, in some embodiments, the one or more apertures 170 may be located within the lip 164. In some embodiments, the one or more apertures 170 may be located within the body 162. In some embodiments, the one or more apertures 170 may be located within the lip 164 and within the body 162.

As illustrated, in some embodiments, the one or more apertures 170 may be located within the inner body 180B. In some embodiments, the one or more apertures 170 may be located within the outer body 180A. In some embodiments, the one or more apertures 170 may be located within the inner body 180B and within the outer body 180A.

As illustrated, in some embodiments, the stepped configuration may be formed on the inner body 180B. In some embodiments, the stepped configuration may be formed on the outer body 180A. In some embodiments, the stepped configuration may be formed at least in part on the inner body 180B and at least in part on the outer body 180A.

Figure 3:
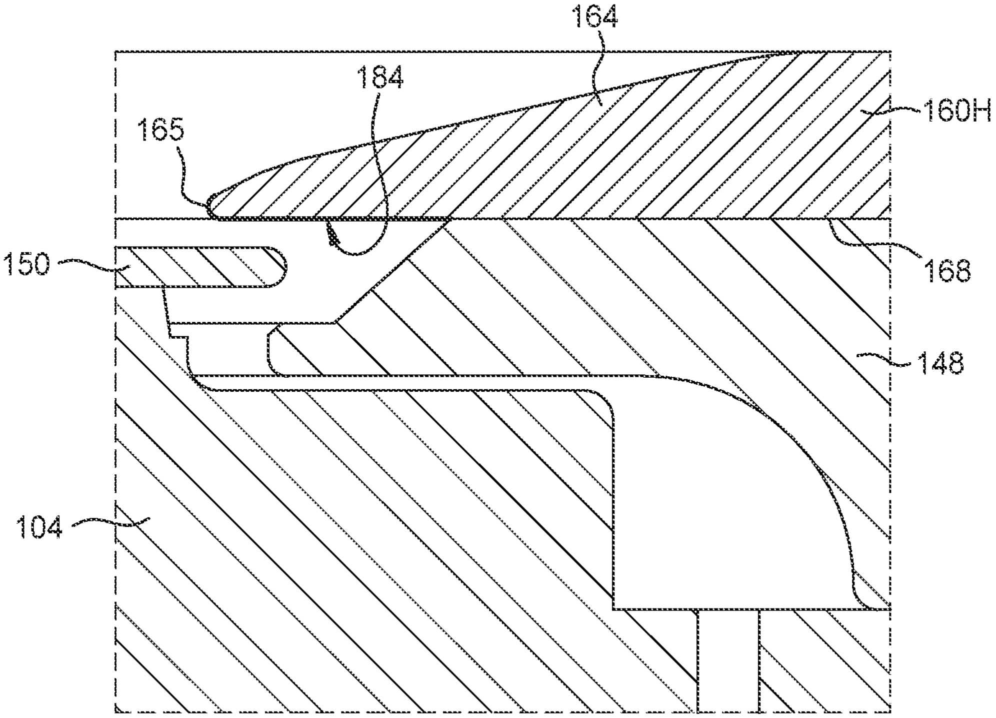

FIG. 3 is a schematic cross-sectional view of a portion of the processing chamber 100 incorporating another embodiment of the shadow ring 160; other items that are common with those depicted in FIGS. 1 and 1A are labeled with the same reference numbers as in FIGS. 1 and 1A. In FIG. 3, the shadow ring 160 is represented by shadow ring 160H, of which only a portion is depicted. The shadow ring 160H is shown resting atop the purge ring 148, and the lip 164 partially overlaps the substrate 150, which is positioned on the substrate support 104. At least a portion 184 of the exposed lower surface 168 of the shadow ring 160H has been subjected to a treatment that decreases the emissivity of the portion 184 of the exposed lower surface 168 of the shadow ring 160H compared to other portions of the shadow ring 160H.

In some embodiments, the treatment includes the application of a coating. The coating is selected such that an emissivity of the coating is less than an emissivity of the material of the body of the shadow ring 160H. In an example, the coating includes a layered structure of tantalum and a tantalum oxide, such as $Ta_2O_5$. In another example, the coating includes a titanium-yttrium ceramic, such as $TiO_2$—$Y_2O_3$.

In some embodiments, the treatment includes polishing the lower surface such that the lower surface is more reflective than a non-polished surface of the shadow ring 160H. In some embodiments, the treatment includes the application of a coating and polishing.

As illustrated, in some embodiments, the inner edge 165 of the lip 164 is subjected to the treatment. Without being bound by theory, it is postulated that, in operation, the treatment applied to the portion 184 of the lower surface 168 and/or the inner edge 165 hinders heat transfer from the substrate 150 to the lip 164 of the shadow ring 160H.

In some embodiments, the shadow ring 160H may incorporate a feature of any one or more of the shadow ring 160A, 160B, or 160C.

In some embodiments of the present disclosure, the processing chamber 100 includes one or more features configured to mitigate the effects of the transfer of heat from the substrate 150 to the shadow ring 160. In some embodiments, the substrate support 104 is adapted to transfer heat to a portion of the substrate 150 near the edge 154 of the substrate 150 that is not in contact with the substrate support 104. In some embodiments, the processing chamber 100 includes equipment adapted to heat the shadow ring separately from any heating of the shadow ring by the substrate support 104.

Figure 4:
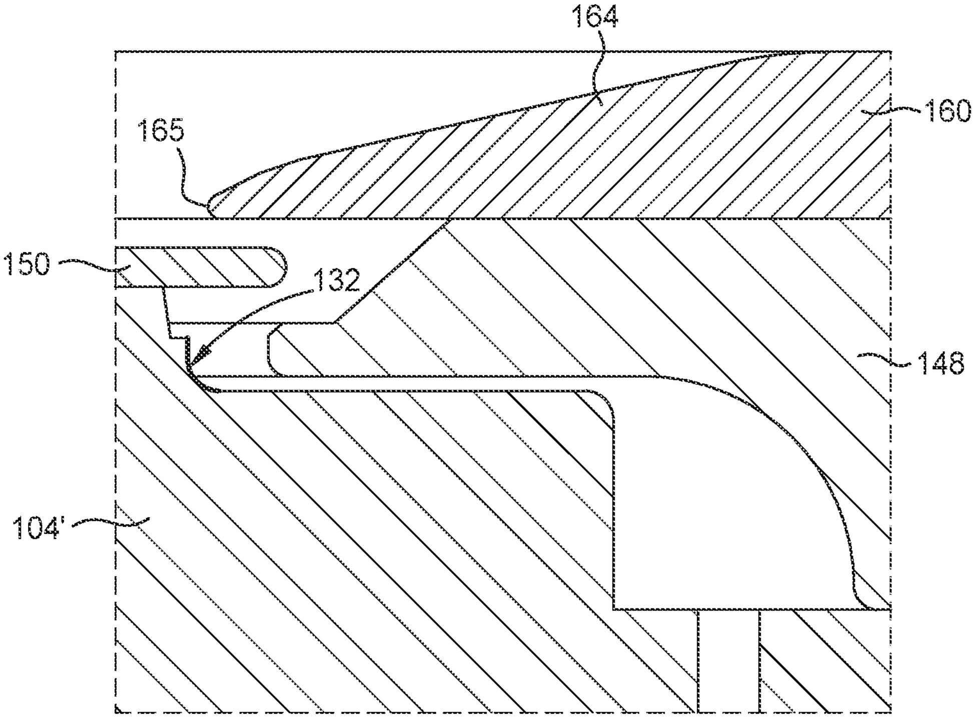

FIG. 4 is a schematic cross-sectional view of an embodiment of the substrate support 104. In FIG. 4, the substrate support 104 is represented by substrate support 104', of which only a portion is depicted; other items that are common with those depicted in FIGS. 1 and 1A are labeled with the same reference numbers as in FIGS. 1 and 1A. The shadow ring 160 is shown resting atop the purge ring 148, and the lip 164 partially overlaps the substrate 150, which is positioned on the substrate support 104'. A portion 132 of the surface of the substrate support 104' has been subjected to a treatment that increases the emissivity of the portion 132 of the surface of the substrate support 104' compared to other portions of the substrate support 104'.

In some embodiments, the treatment includes the application of a coating. The coating is selected such that an emissivity of the coating is greater than an emissivity of the material of the substrate support 104'. In an example, the coating includes oxidized Inconel 718.

The portion 132 of the surface of the substrate support 104' transmits heat by radiation to the portion of the substrate 150 near the edge 154 of the substrate 150 that is not in contact with the substrate support 104'. Such transfer of heat at least partially compensates for the transfer of heat from the portion of the substrate 150 near the edge 154 of the substrate 150 to the lip 164 of the shadow ring 160. The reduction in temperature experienced by the portion of the substrate 150 near the edge 154 of the substrate 150 is mitigated at least partially by the transfer of heat from the portion 132 of the surface of the substrate support 104' that has been subjected to the emissivity-enhancement treatment.

In some embodiments, the shadow ring 160 may incorporate a feature of any one or more of the shadow ring 160A, 160B, 160C, or 160H.

Figure 5:
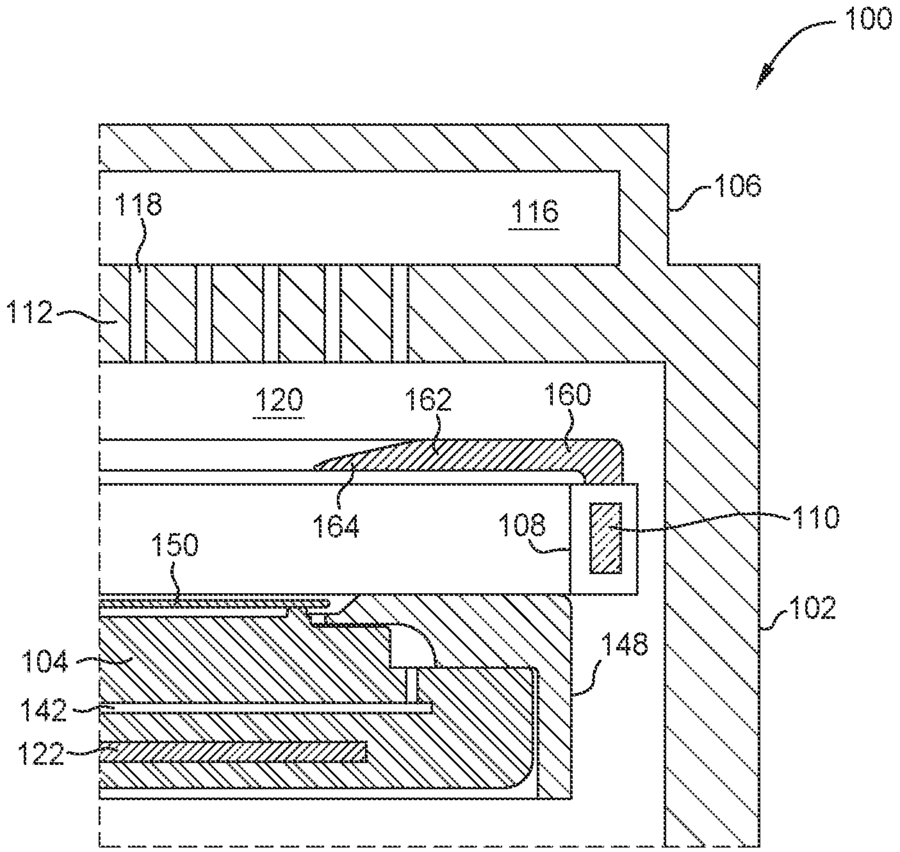

FIG. 5 is a schematic cross-sectional view of a portion of the processing chamber 100 incorporating another embodiment of the present disclosure. Items that are common with those depicted in FIGS. 1 and 1A are labeled with the same reference numbers as in FIGS. 1 and 1A. The processing chamber 100 includes a liner 108. The substrate support 104 is shown in a lowered position, such as when the substrate 150 is loaded into, or unloaded from, the processing chamber 100. Moving the substrate support 104 from a raised position, at which processing operations are conducted, to the lowered position has resulted in the shadow ring 160 being lifted off the purge ring 148 and deposited on the liner 108. The liner 108 is heated by a heater 110. While the shadow ring 160 remains on the liner 108, the liner 108 heats the shadow ring 160.

When the substrate support 104 is raised in preparation for processing the substrate 150, the shadow ring 160 is lifted off the liner 108 by the purge ring 148. Having been heated by the liner 108, the shadow ring 160 is less of a heat sink than if the shadow ring 160 had not been heated by the liner 108. Heat transfer from the lip 164 of the shadow ring 160 to the rest of the body 102 of the shadow ring 160 is not as great as if the shadow ring 160 had not been heated by the liner 108. While processing the substrate 150, the temperature of the lip 164 increases due to an initial heat transfer from the substrate 150. However, the rate of heat transfer from the lip 164 to the rest of the body 162 of the shadow ring 160 is lower than if the shadow ring 160 had not been heated by the liner 108. The rate of heat transfer from the substrate 150 to the lip 164 diminishes, and heat loss from the substrate 150 to the lip 164 reduces.

In some embodiments, the shadow ring 160 sits on the liner 108 close to the showerhead 112. In some embodiments, the showerhead 112 includes a heater that heats the shadow ring 160. In some of such embodiments, the liner does not include a heater.

In some embodiments, the shadow ring 160 may incorporate a feature of any one or more of the shadow ring 160A, 160B, 160C, or 160H. In some embodiments, at least a portion of a surface of the substrate support 104 may incorporate the surface treatment of the substrate support 104'.

Figure 6:
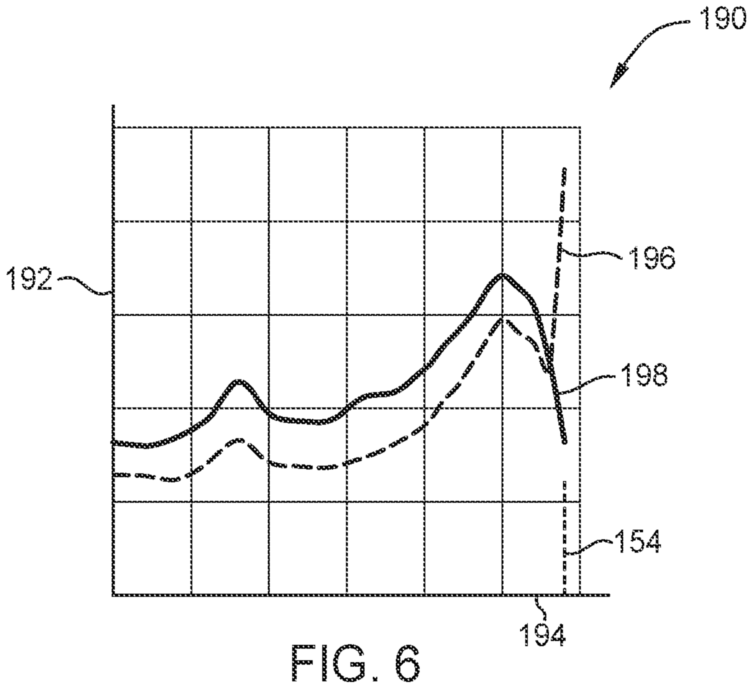

FIG. 6 is a graph 190 illustrating an exemplary result obtained from implementing an embodiment of the present disclosure. The graph 190 illustrates a deposition thickness (Y axis, 192) of a substance, such as a metal, such as tungsten, on the substrate 150 plotted with respect to the location along a radius from the center of the substrate 150 (X axis, 194). The line 196 represents a typical result obtained without implementing any of the embodiments of the present disclosure. The line 198 represents a result achieved using the shadow ring 160A, incorporating the apertures 170.

Line 196 shows a significant deposition occurring towards the edge 154 of the substrate 150 compared with deposition across the rest of the substrate 150. Such deposition towards the edge 154 of the substrate 150 is undesirable. Because the operations conducted in a processing chamber 100 are subject to influence by many variables, an evaluation between line 196 and line 198 is appropriately limited to comparing the characteristics of each line 196, 198 rather than the absolute values recorded. Nevertheless, the beneficial effect of the shadow ring 160A upon deposition towards the edge 154 of the substrate 150 is demonstrated.

In a processing operation, embodiments of the present disclosure promote an even deposition of substances onto a substrate while mitigating a tendency for detrimental deposition at the edge of the substrate. The consistency of product quality produced by processing chambers incorporating one or more embodiments of the present disclosure is greater than the consistency of product quality produced by processing chambers not incorporating one or more embodiments of the present disclosure.

It is contemplated that elements and features of any one disclosed embodiment may be beneficially incorporated in one or more other embodiments. While the foregoing is directed to embodiments of the present disclosure, other and further embodiments of the disclosure may be devised without departing from the basic scope thereof, and the scope thereof is determined by the claims that follow.

What is claimed is:

1. A shadow ring set for a processing chamber, the shadow ring set comprising:

a purge ring; and a shadow ring, the shadow ring comprising:

an annular member including a body, a lip projecting radially inwardly from the body, an upper surface, and a lower surface, wherein the upper surface is stepped such that a thickness of the lip from the upper surface to the lower surface is less than a thickness of the body from the upper surface to the lower surface; and a plurality of apertures in the annular member, each aperture extending from a corresponding upper opening at the upper surface of the shadow ring to a corresponding lower opening at the lower surface of the shadow ring;

wherein the lower surface of the shadow ring is configured to contact an upper surface of the purge ring such that the purge ring blocks passage of a purge gas through the plurality of apertures.

2. The ring set of claim 1, wherein at least one aperture of the plurality of apertures is a circular hole.

3. The ring set of claim 1, wherein at least one aperture of the plurality of apertures is a slot.

4. The ring set of claim 1, further comprising a neck between each pair of adjacent apertures of the plurality of apertures.

5. The ring set of claim 4, wherein the plurality of apertures is arranged in a first circle such that the apertures of the first circle are equidistant from a geometric center of the shadow ring.

6. The ring set of claim 5, wherein the plurality of apertures is arranged in a second circle surrounding and concentric with the first circle.

7. The shadow ring of claim 4, wherein the neck creates a thermal choke to transfer of heat between the lip and the body.

8. The ring set of claim 1, wherein the body includes:

an outer body including an inwardly projecting flange; and an inner body including the lip, the inner body at least partially disposed on the flange.

9. The ring set of claim 8 wherein an aperture of the plurality of apertures is in the inner body.

10. The ring set of claim 8 wherein an aperture of the plurality of apertures is in the outer body.

11. The ring set of claim 1, wherein:

the shadow ring comprises a first material including a first emissivity; and the shadow ring further comprises a coating of a second material on at least a portion of the lower surface at the lip, the second material including a second emissivity lower than the first emissivity.

12. The ring set of claim 11, wherein the second material comprises a layered structure of tantalum and a tantalum oxide.

13. The ring set of claim 11, wherein the second material comprises a titanium-yttrium ceramic.

14. A processing chamber comprising:

a chamber body;

a liner disposed within the chamber body, the liner including a heater;

a substrate support enclosed within the chamber body, the substrate support including a support surface configured to receive a substrate, and movable between a raised position and a lowered position;

a purge ring disposed on the substrate support, the purge ring including a lower surface below a level of the support surface and an upper surface above the level of the support surface; and a shadow ring including a plurality of apertures, each aperture extending from a corresponding upper opening at an upper surface of the shadow ring to a corresponding lower opening at a lower surface of the shadow ring;

wherein:

when the substrate support is in the raised position, the shadow ring is disposed on the purge ring such that the lower surface of the shadow ring contacts the upper surface of the purge ring, and the purge ring blocks the plurality of apertures; and when the substrate support is in the lowered position, the shadow ring is disposed on the liner.

15. The processing chamber of claim 14, wherein the shadow ring comprises:

an annular member including a body and a lip projecting radially inwardly from the body.

16. The processing chamber of claim 15, wherein the shadow ring further comprises:

a first material including a first emissivity; and a coating of a second material on at least a portion of the lower surface at the lip, the second material including a second emissivity lower than the first emissivity.

17. The processing chamber of claim 16, wherein the second material comprises one of:

a layered structure of tantalum and a tantalum oxide; or a titanium-yttrium ceramic.

18. The processing chamber of claim 14, wherein the shadow ring comprises:

an outer body including an inwardly projecting flange; and an inner body including a radially inwardly projecting lip, the inner body at least partially disposed on the flange.

19. The processing chamber of claim 14, wherein the shadow ring further comprises a neck between each pair of adjacent apertures of the plurality of apertures.

20. The processing chamber of claim 19, wherein the neck creates a thermal choke to transfer of heat between the lip and the body.

* * * * *